United States Patent
Batz et al.

(10) Patent No.: US 10,510,484 B2
(45) Date of Patent: Dec. 17, 2019

(54) FORMING AN ELECTRICAL COIL DEVICE BY CUTTING A STRIP CONDUCTOR WINDING INTO AT LEAST TWO PARTIAL COILS

(71) Applicant: Siemens Aktiengesellschaft, Munich (DE)

(72) Inventors: Otto Batz, Leutenbach (DE); Dietmar Bayer, Heroldsbach (DE); Michael Frank, Uttenreuth (DE); Marijn Pieter Oomen, Erlangen (DE); Peter van Hasselt, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 184 days.

(21) Appl. No.: 15/301,827

(22) PCT Filed: Mar. 24, 2015

(86) PCT No.: PCT/EP2015/056237
§ 371 (c)(1),
(2) Date: Oct. 4, 2016

(87) PCT Pub. No.: WO2015/150165
PCT Pub. Date: Oct. 8, 2015

(65) Prior Publication Data
US 2017/0117095 A1    Apr. 27, 2017

(30) Foreign Application Priority Data
Apr. 4, 2014 (DE) .......................... 10 2014 206 506

(51) Int. Cl.
*H01F 41/04* (2006.01)
*H01F 6/06* (2006.01)
(Continued)

(52) U.S. Cl.
CPC ....... *H01F 41/048* (2013.01); *G01R 33/3815* (2013.01); *H01F 6/06* (2013.01)

(58) Field of Classification Search
CPC ...... G01R 33/3815; H01F 41/048; H01F 6/06
See application file for complete search history.

(56) References Cited

U.S. PATENT DOCUMENTS

| 4,970,483 A | 11/1990 | Wicker et al. ................ 505/211 |
| 6,646,528 B2 | 11/2003 | Ehrenberg et al. ........... 335/216 |

(Continued)

FOREIGN PATENT DOCUMENTS

| DE | 2358398 A1 | 6/1974 | ............. H01F 17/00 |
| DE | 3811749 A1 | 10/1989 | ............. H01F 41/04 |

(Continued)

OTHER PUBLICATIONS

German Office Action, Application No. 102014206506.2, 7 pages, dated Dec. 9, 2014.

(Continued)

*Primary Examiner* — Minh N Trinh
(74) *Attorney, Agent, or Firm* — Slayden Grubert Beard PLLC

(57) ABSTRACT

A method for producing an electrical coil device may include winding a strip conductor into a coil winding and subsequently dividing the coil winding into at least two partial coils by at least one cut through the coil winding, wherein the strip conductor remains connected as a doubly contiguous loop by existing remaining connections in the end regions of the strip conductor. An electric coil device is also disclosed, which includes at least two partial coils from a higher-level doubly contiguous strip conductor. The at least two partial coils may be produced by subsequent cutting of a coil winding wound by a single strip conductor.

14 Claims, 6 Drawing Sheets

(51) Int. Cl.
*G01R 33/3815* (2006.01)
*H01F 41/12* (2006.01)

(56) References Cited

U.S. PATENT DOCUMENTS

| | | | | |
|---|---|---|---|---|
| 8,178,473 B2* | 5/2012 | Hong | ............ | H01F 6/06 29/599 |
| 8,712,489 B2 | 4/2014 | Schauwecker et al. | ...... | 505/211 |
| 8,809,685 B2 | 8/2014 | Bianchetti et al. | ........ | 174/125.1 |
| 8,897,846 B2 | 11/2014 | Drechsler et al. | ............ | 505/220 |
| 9,117,576 B2* | 8/2015 | Oomen | .................... | H01F 5/02 |
| 2002/0173429 A1 | 11/2002 | Ehrenberg et al. | ........... | 505/211 |
| 2008/0236869 A1 | 10/2008 | Marte et al. | ................ | 174/125.1 |
| 2010/0190649 A1 | 7/2010 | Doll et al. | .................... | 505/220 |
| 2012/0108435 A1 | 5/2012 | Ichiki et al. | ................. | 505/230 |
| 2015/0340139 A1* | 11/2015 | Arndt | .................... | H01F 41/12 505/211 |
| 2017/0084371 A1* | 3/2017 | Batz | .................... | G01R 33/381 |
| 2017/0117095 A1* | 4/2017 | Batz | .................... | H01F 41/048 |

FOREIGN PATENT DOCUMENTS

| | | | | |
|---|---|---|---|---|
| DE | 102009022672 A1 | 12/2010 | ............... | H01R 4/68 |
| DE | 102009043580 A1 | 4/2011 | ............. | H01L 39/12 |
| DE | 102010042598 A1 | 4/2012 | ......... | G01R 33/3815 |
| DE | 102011082652 B4 | 8/2013 | ............. | H01F 41/06 |
| DE | 102012217990 A1 | 4/2014 | ......... | G01R 33/3815 |
| DE | 102013207222 A1 | 10/2014 | ......... | G01R 33/3815 |
| DE | 102014207373 A1 | 10/2015 | ......... | G01R 33/3815 |
| EP | 2879238 A1 | 6/2015 | ............. | B29C 43/00 |
| GB | 700451 A | 12/1953 | ............. | H01C 17/04 |
| WO | 2015/150165 A1 | 10/2015 | ............. | H01F 41/04 |

OTHER PUBLICATIONS

International Search Report and Written Opinion, Application No. PCT/EP2015/056237, 19 pages, dated Sep. 11, 2015.

Iwasa, Yukikazu et al, "A 'Persistent Mode' Magnet Comprised of YBCO Annuli," IEEE Transactions on Applied Superconductivity, vol. 15, No. 2, pp. 2352-2355, Jun. 1, 2005.

Kiyoshi, Tsukasa et al., "HTS-NMR: Present Status and Future Plan," IEEE Transactions on Applied Superconductivity, vol. 20, No. 3, pp. 714-717, Jun. 1, 2010.

* cited by examiner

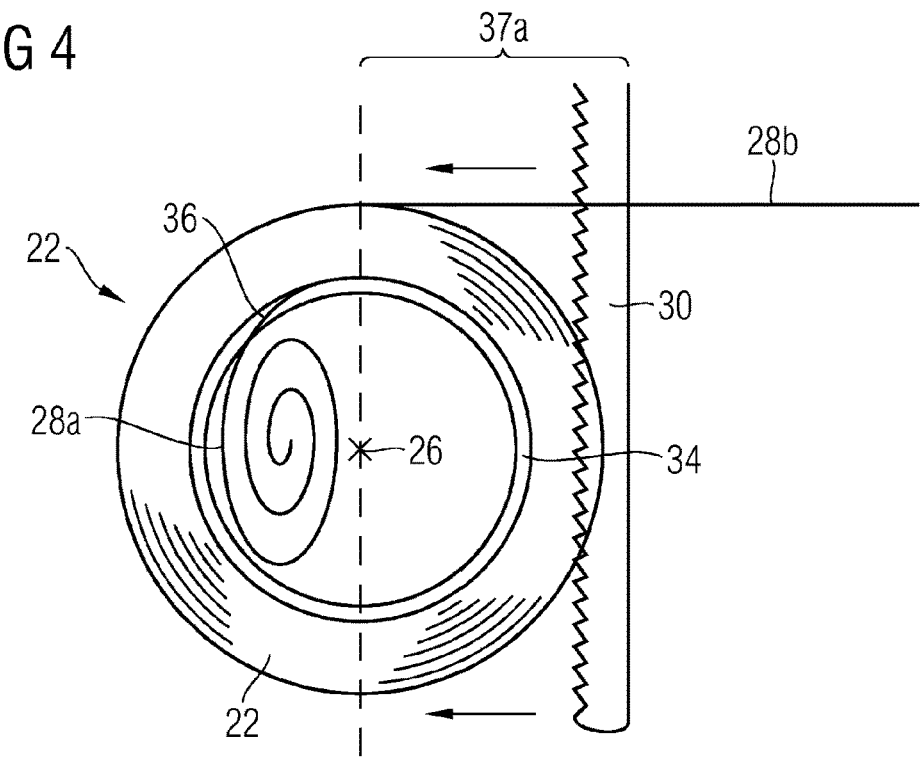
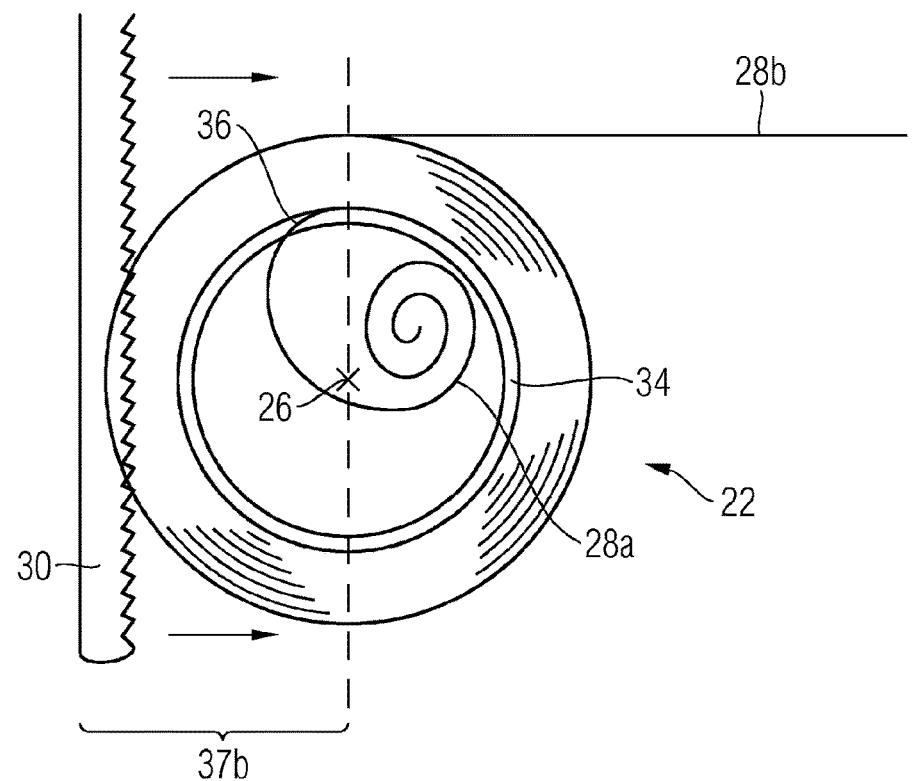

FORMING AN ELECTRICAL COIL DEVICE BY CUTTING A STRIP CONDUCTOR WINDING INTO AT LEAST TWO PARTIAL COILS

CROSS-REFERENCE TO RELATED APPLICATIONS

This application is a U.S. National Stage Application of International Application No. PCT/EP2015/056237 filed Mar. 24, 2015, which designates the United States of America, and claims priority to DE Application No. 10 2014 206 506.2 filed Apr. 4, 2014, the contents of which are hereby incorporated by reference in their entirety.

TECHNICAL FIELD

The present invention relates to an electrical coil device having at least two partial coils from a higher-level doubly contiguous strip conductor and a method for the production of such a coil device.

BACKGROUND

Superconducting coils are used to generate strong, homogeneous magnetic fields, said superconducting coils being operated in a sustained short-circuit current mode. For example, homogeneous magnetic fields with magnetic flux densities between 0.5 T and 20 T are required for nuclear magnetic resonance spectroscopy (NMR spectroscopy) and for magnetic resonance imaging. These magnets are typically charged via an external electric circuit and are then separated from the external power source since, in the resulting sustained short-circuit current mode, a nearly lossless current flow occurs within the superconducting coil. The resulting, strong magnetic field is particularly stable over time since it is not affected by the noise contributions of an external electric circuit.

During the use of known winding techniques, one or more superconducting wires are wound on support bodies, wherein different wire segments are maintained in contact with one another by wire connections with optimally low ohmic resistance or via superconducting connections. For conventional low-temperature superconductors, such as NbTi and Nb$_3$Sn with transition temperatures below 23 K, technologies exist for the establishment of superconducting contacts to link wire segments and to connect the windings with a superconducting sustained current switch. The superconducting sustained current switch is thereby part of the electrical circuit of the coil and is placed in a resistive conductive state by heating in order to inject an external current. After deactivating the heating and cooling down to the operating temperature, this part of the coil is also superconducting again.

High-temperature superconductors, also called high-$T_a$ superconductors (HTS) are superconducting materials with a transition temperature above 25 K, and above 77 K for some material classes, such as cuprate superconductors with which the operating temperature can be achieved by cooling with cryogenic materials other than liquid helium. HTS materials are particularly attractive for the production of magnetic coils for NMR spectroscopy and magnetic resonance imaging, since many materials have high upper critical magnetic fields of over 20 T. Due to the higher critical magnetic fields, the HTS materials are in principle better suited than low-temperature superconductors for the generation of high magnetic fields of over 10 T for example.

One problem with the production of HTS magnetic coils is the absence of suitable technologies to produce superconducting HTS connections, in particular for second generation HTS, so-called 2G-HTS. The 2G-HTS wires are typically present in the form of flat strip conductors. If resistive contacts are introduced between the superconducting strip conductors, the losses in the coil can no longer be ignored and the generated magnetic field noticeably drops over a time period of a few hours or days.

DE 10 2010 042 598 A1 discloses a superconducting MR magnet arrangement comprising a superconducting strip conductor that is provided in the longitudinal direction with a slit between the two ends so that the superconducting strip conductor forms a closed loop surrounding the slit. The slit superconducting strip conductor is wound to form a multi-section coil made up of at least two partial coils that are arranged rotated counter to one another so that they generate a predetermined magnetic field curve in a measurement volume.

DE 10 2011 082 652 B4 also discloses a magnetic coil arrangement with a slit superconducting strip conductor and additionally a method for the production of such a magnetic coil arrangement. With the disclosed production method, the two half strips of the strip conductor are initially each wound onto an intermediate coil. Then, turns of the first and second half strips are wound onto one common winding body in alternation from the intermediate coils.

These winding methods described in the prior art have the drawback that the winding of the partial coils from the conductor branches of the slit strip conductor is relatively complex. With the parallel conductor guidance suggested in application 102013207222.8, the observance of a constant winding tension for each conductor branch is difficult, since the two conductor branches may have slight deviations in their lengths and/or elasticity under tension. However, a uniform and constant winding tension is of great importance for the quality and the dimensional stability of the resulting coil winding. In particular, uniform winding tension is important in order to be able to produce a coil winding without inclusions and/or cavities. With the production method disclosed in DE 10 2011 082 652 B4 using two intermediate coils, the conductor branches are guided in parallel. In all variants of the production method disclosed, they are twisted with respect to each other and/or out of the coil winding, in other words, they are twisted about an axis in the direction of their longitudinal extension. This torsion results in stress on the superconducting strip which can result in damage to the materials and their electrical and/or mechanical properties.

A further drawback of the known winding methods consists in the fact that, when wound simultaneously, the two conductor branches have to be guided substantially next to one another and it is therefore difficult to insulate the individual conductor branches electrically from one another. Finally, early planning of the strip conductor length to be wound is necessary because the length of the slit strip conductor used for the winding predetermines the dimensions of the coil to be wound. The complete slit conductor length has to be wound even if, for example, deviations in the conductor thickness cause the desired number of turns or winding height to be fallen below or exceeded. The slicing of the strip conductor material and the processing of the strip conductor slit in this way can also easily result in quality problems and material damage.

SUMMARY

One embodiment provides a method for the production of an electrical coil device, the method comprising winding a strip conductor into a coil winding and dividing the coil winding into at least two partial coils by means of at least one cut through the coil winding, wherein the strip conductor remains connected as a doubly contiguous loop by means of remaining connections in its end regions.

In one embodiment, the winding of the strip conductor is performed within a winding plane and with which the at least one cut through the coil winding is performed substantially parallel to said winding plane.

In one embodiment, following the winding, in each case an internal and/or an external end piece of the strip conductor remains as an unwound projection in addition to the turns of the coil winding.

In one embodiment, at least one part of the unwound projection of at least one of the end piece is also divided into two conductor parts.

In one embodiment, the division of the strip conductor in the region of the unwound projection is performed in a separate process step following the cutting of the coil winding.

In one embodiment, the division of the coil winding into at least two partial coils is performed by a dividing apparatus with a penetration depth into the coil winding that does not reach a center point of the coil winding.

In one embodiment, the division of the coil winding is performed by a plurality of partial cuts, wherein in each partial cut a circumferential segment of the coil winding is severed.

In one embodiment, the strip conductor is wound onto a winding support with a cylindrical winding surface, wherein the winding support is provided with a slit-shaped recess into which an internal end piece of the strip conductor is introduced prior to the winding.

In one embodiment, the division of the coil winding is performed by sawing, water-jet cutting and/or laser cutting.

In one embodiment, after the division, the at least two partial coils are spatially arranged such that magnetic fields generated thereby on a current flow through the common strip conductor are mutually reinforcing.

In one embodiment, during the production of the coil winding, the strip conductor is impregnated with an impregnating agent which is cured after the production of the coil winding.

In one embodiment, the coil winding is divided by more than one cut into more than two partial coils.

In one embodiment, a strip conductor with a superconducting layer is used for the production of the coil winding.

In one embodiment, a strip conductor with at least one insulating layer is used for the production of the coil winding.

Another embodiment provides an electrical coil device with at least two partial coils from a higher-level doubly contiguous strip conductor, wherein the at least two partial coils are produced by subsequent cutting of a coil winding wound by a single strip conductor.

BRIEF DESCRIPTION OF THE DRAWINGS

Example aspects and embodiment of the invention are described below with reference to the attached drawings, in which:

FIG. 4 is a schematic view of a first partial cut according to a second exemplary embodiment, FIG. 5 is a schematic view of a second partial cut according to the second exemplary embodiment.

DETAILED DESCRIPTION

Figure 1:
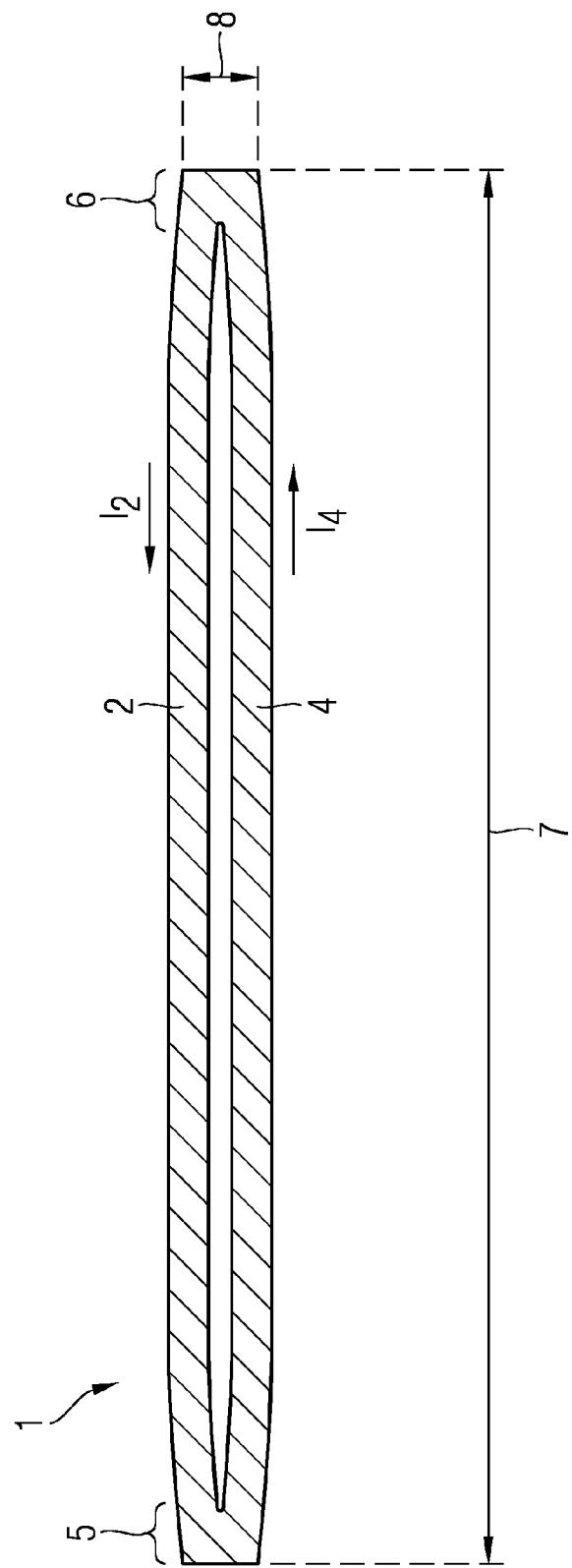
FIG. 1 is a schematic top view of a superconducting strip conductor with doubly contiguous topology.

Embodiments of the invention provide a method for the production of an electrical coil device which avoids the aforementioned drawbacks. In particular, some embodiments provide a less complex method (as compared with conventional methods) with which a coil winding can be produced with a plurality of sub-conductors which are contiguous at the end regions. Other embodiments provide a coil device produced using the disclosed method.

Some embodiments provide a method for the production of an electrical coil device including the following steps:
winding a strip conductor into a coil winding and
subsequent division of the coil winding into at least two partial coils by means of at least one cut through the coil winding, wherein the strip conductor remains connected as a doubly contiguous loop by means of remaining connections in its end regions.

In this context, the strip conductor is in particular an elongated conductor in the form of a flat strip. It can comprise a layer stack comprising or consisting of numerous layers made of different materials. The finished coil device should include a doubly contiguous loop of a strip conductor of this kind. Here, the term "doubly contiguous" with respect to geometric topology should be understood as meaning that the strip conductor has the topology of a simple loop with a hole. A doubly contiguous strip conductor of this kind can, for example, be obtained by slicing a singly contiguous strip conductor in the longitudinal direction resulting in the creation of two conductor branches which are contiguous at both ends of the original strip.

In some embodiments, an electrical coil winding with a plurality of partial coils is to be produced from a doubly contiguous strip conductor in that initially a singly contiguous strip conductor is wound and the coil winding created thereby is then cut into two partial coils so that a doubly contiguous loop of the strip conductor is formed.

One difference from the prior art with which a strip conductor of this kind is first slit and then wound consists in that fact that the winding process is substantially simplified. The reversal of the temporal sequence of 'winding step' and 'dividing step' has numerous advantages:

With the first step of the disclosed method, winding the singly contiguous strip conductor, it is only necessary to wind one conductor branch. In this context, therefore, it is possible to use sufficiently well known and optimized winding methods for the production of single coils without a plurality of conductor branches having to be guided parallel to one another. It is in particular possible to maintain a constant winding tension during the winding of one single strip conductor in a relatively simple way.

Neither do any space issues arise as a result of the closely adjacent guidance of a plurality of parallel conductor branches.

The relatively time-consuming process step of pre-slicing the unwound strip conductor is omitted thus enabling an overall quicker and less complex production method. Slicing a very long conductor strip with a high degree of precision is complex and difficult.

The fact that the winding is performed with a non-slit strip conductor means it is not necessary for the length of the conductor used to be defined precisely before the winding. The conductor length required in each case can be unwound from a supply coil, wherein the length of each piece used can be determined dynamically, in order, for example, to achieve a predetermined number of turns or winding height. By contrast, before the winding of a pre-slit strip conductor, the length of the strip conductor to be wound has to be precisely defined since it was already determined during the pre-slicing. If, then, for example, less than the pre-slit strip conductor is required, there will inevitably be excess material remaining in the region of the contiguous end piece in the coil device. If, in the opposite case, the pre-slit strip conductor is not sufficient to achieve a defined number of turns or winding height, it is necessary to prepare a new, longer slit strip conductor.

This also avoids the high mechanical stress which can occur when slicing loose, still unwound strip conductor material. This mechanical stress can result in damage to the conductive layer of the strip conductor, in particular in the case of sensitive superconducting layers. Damage of this kind, even on only small part of an elongated strip conductor, would greatly impair the sustained current properties of the conductor loop.

The disclosed electrical coil device may comprise at least two partial coils from a higher-level doubly contiguous strip conductor. In this context, the at least two partial coils are produced by subsequent cutting of a coil winding wound by means of a single strip conductor.

The advantages of embodiments of the coil device are similar to the advantages described in connection with the production method. Hence, in particular, a coil device of this kind can be produced with a less complex and/or less error-prone method. A coil device obtained by winding and then cutting the coil winding as disclosed herein can be easily identified from the traces of the cutting step. Typical cutting traces, which depict a direction of movement of the cutting apparatus used then namely extend over multiple adjacent turns of the underlying conductor.

The winding of the strip conductor can be performed within one winding plane and the at least one cut through the coil winding can be made substantially parallel to this winding plane. In other words, the coil winding can be a flat coil which is divided by one cut within its winding plane into two conductor parts which are still contiguous at the ends. This embodiment is the simplest type of the subsequent division of coil winding into at least two contiguous partial coils. In this context, the winding plane extends perpendicular to a central winding axis.

Following the winding, it is in each case possible for an internal and/or an external end piece of the strip conductor to remain as an unwound projection next to the coil winding. Hence, with this embodiment the complete strip conductor is not wound, instead free end pieces remain outside and are then easy to exclude from the cutting process. Particularly advantageously, the non-wound internal and external end pieces are longer than the remaining connections in the respective end regions. This advantageously facilitates a relative movement of the two partial coils relative to one other after the cutting step.

For example, the length of the unwound internal and/or external projection can advantageously be between 1 cm and 200 cm. It can particularly advantageously be between 0.5 times and twice the greatest dimension of the wound coil. In the case of a circular coil winding, it can therefore, advantageously be between 0.5 times and twice the diameter of the coil winding. For example, one of the two partial coils can be rotated by 180° after the division and re-assembled with the other partial coil so that the magnetic fields generated are mutually reinforcing. The length of the still connected end regions of the strip conductor can advantageously be between one and ten times the width of the original non-slit conductor.

Alternatively to the embodiment described in which an internal and/or external end piece is not included in the winding, it is also possible initially for the entire length of the strip conductor to be wound internally and/or externally and then subsequently an end piece thereof to be unwound again from the coil winding. This unwinding can preferably take place before the cutting into two partial coils in order to prevent the complete division of the strip conductor in the end region.

At least one part of the unwound projection of at least one of the end pieces can also be divided into two conductor parts. In other words, the cut created by the division into two partial coils can extend over one part of the end pieces. The unwound projection is then therefore longer on the corresponding side than on the still connected end region.

In this context, the described division in the region of the projection of at least one of the end pieces is performed in a separate process step following the cutting of coil winding. This embodiment has the advantage that, in this context, the process of the slicing can be performed in a particularly careful and controlled manner in the region of the end pieces since in this case it is particularly important for the cut not to include the outermost end region that is to remain connected. Moreover, the strip conductor is more mechanically sensitive in the region of the unwound projection since it is not held by the winding packet. In the case of an embodiment with encapsulation and/or bonding of the coil winding, the unwound projection is advantageously not also bonded or encapsulated so that, in this region, the strip conductor is less well protected from mechanical stresses. The process of cutting into two conductor branches can then advantageously be performed with a different cutting method adapted to this higher sensitivity.

The division of the coil winding into at least two partial coils can be performed by a dividing apparatus with a penetration depth into the coil winding that does not extend to a center point of the coil. This embodiment is particularly advantageous for protecting the inner end region of the strip conductor against complete severance. For example, an unwound inner projection of the strip conductor can be arranged in a radial inner region close to the winding axis. This ensures that the inner end region is not also severed when the penetration depth of the cutting apparatus does not penetrate as far as this radial inner region.

Alternatively, the strip conductor can also be fully wound in the inner region of the coil. Then if, at least in a part segment of the coil winding, the penetration depth of the cutting apparatus does not penetrate as far as the inner end region of the strip conductor, even in the case of complete winding, severance in the region of the end piece can be avoided.

An incomplete division in the internal end region can, for example, be achieved in that that the coil winding is cut radially from the outside with a cutting apparatus with a fixed radial penetration depth from a plurality of angles. For example, a sawing apparatus can be applied from the outside in a radial-circumferential direction with which the saw blade or the saw wire does not reach as far as the internal turns and/or as far an inner projection in the center of the winding.

The division of the coil winding can be performed by means of a plurality of partial cuts, wherein in each partial cut a circumferential segment of the coil winding is severed. In other words, a dividing apparatus can be applied in different angular regions of the coil winding to be severed one after the other. In this context, the penetration depth can either extend as far as the center of coil winding or it can, for example, be radially limited as described above.

With this embodiment, an inner end region of the strip conductor to be protected against severance can, for example, be present as an unwound projection that is free moving and, during the different partial steps of the dividing process, can in each case be moved in an angular segment that is not penetrated by the dividing apparatus.

The strip conductor can be wound onto a winding support with a cylindrical winding surface. In this case, the winding support can be provided with a slit-shaped recess in which an internal end piece of the strip conductor is introduced prior to the winding. This embodiment is particularly advantageously suitable for producing an inner unwound projection of the strip conductor which is either not divided or only partially divided during the cutting of the coil winding into two partial coils. For example, during the cutting of the coil winding, it is possible to cut from the outside only as far as this winding support, thus ensuring that the part of the strip conductor lying within the winding support remains protected against severance. However, it is also possible for part of the unwound inner projection to be slit still further so that the end piece of the strip conductor that remains connected is shorter than the unwound projection.

The winding support can particularly advantageously be made of two portions that can be divided from one another so that, following the cutting through of the main part of the strip conductor, two partial coils are created that can be moved with respect to one another and are each case arranged on a portion of the winding support For example, such portions can be connected and divided again by means of plug-in connections.

Alternatively, however, the winding support can also be made of one central piece which is divided either during the cutting of the coil winding or subsequently in a separate process step once again by cutting into two portions. In each case, it is advantageous for the partial coils created by the cutting in each case to be able to remain on the portion of the winding support following the winding and to be moved therewith.

However, it is also possible for the partial coils to be separated from the winding support before or after their division and to remain either as self-supporting coils or to be transferred to another coil support. Particularly advantageously, the coil winding or the partial windings can be detached from their original winding support following an encapsulation or bonding step.

The division of the coil winding can advantageously be performed by sawing, water-jet cutting and/or laser cutting. For example, the sawing can be performed by means of a diamond wire saw. In the case of laser cutting, the mechanical stress of the strip conductor to be cut is advantageously low.

Following the separation, the at least two partial coils can be spatially arranged such that magnetic fields generated thereby on a current flow through the common strip conductor are mutually reinforcing. This can advantageously be achieved by rotating them with respect to one another. For example, one partial coil can be turned by a half rotation with respect to the other such that it can again be arranged adjacent thereto about a common axis of symmetry. Following the turning of a partial coil of this kind, the higher-level magnetic field generated by the two partial coils is particularly high.

During the production of the coil winding, the strip conductor can be impregnated with an impregnating agent, which is cured following the winding of the coil winding. In other words, the coil winding can be produced in a so-called wet winding process. The curing of the impregnating agent then endows the coil winding with its mechanical strength. Particularly advantageously, the cut through the coil winding can then only take place after the curing of the impregnating agent so that the strip conductor is stressed as little as possible by the cutting. With this embodiment, it is also advantageous for the internal and/or external end regions not be impregnated as well or at least not cured so that the end regions remain free moving and hence the partial coils can also be moved with respect to one another.

Alternatively or additionally to impregnation, the coil winding can be encapsulated with an encapsulating agent, wherein the encapsulating agent is also cured. Here, it is again advantageous for the end regions of the strip conductor not to be encapsulated as well but to remain as movable as possible.

The coil winding can be divided into more than two partial coils by more than one cut. In particular, to this end, it is possible for a plurality of partial cuts extending in parallel to be performed all of which lie parallel to the winding plane of the original coil winding. The strip conductor can then again remain partially connected in the end regions so that here once again the partial cuts produce a doubly contiguous higher-level conductor loop. To this end, it can be helpful or necessary also to produce additional transverse divisions and/or continuations of some part of the cuts in the region of the end pieces. These transverse divisions and/or continuations can advantageously be performed in one or more additional process steps following the actual division of the body of the coil winding. The division into more than two partial coils can be advantageous for forming a larger coil system for the generation of strong and/or complex magnetic fields.

In particular, in a more complex coil system, the partial coils can also be embodied asymmetrically in that the coil winding is divided into partial coils with different thicknesses. The partial coils then have different strip widths and hence different current carrying capacities. This can be used in a targeted manner, for example to position the coils with the wider strips at places in the system where the local magnetic fields on the winding are higher. An asymmetrical division of this can also be advantageous for a system with only two partial coils in order to generate an asymmetrical magnetic field in a targeted manner and/or to compensate asymmetrical ambient influences in a targeted manner.

The coil winding can be a cylindrical coil winding with a base area in the form of a circle, an ellipse, an oval, a race track geometry or a rectangle with rounded corners. A symmetrical structure of this kind has the result that two or more partial coils divided from one another can be once again arranged adjacent to one another on a common base area following a rotation of the partial coils.

A strip conductor with a superconducting layer can be used to produce the coil winding. For a strip conductor of this kind, the method described is particularly suitable for creating a coil system with a doubly contiguous strip conductor loop with a continuous superconductive layer. A coil system of this kind can be particularly advantageously used for sustained continuous current operation, for example for magnetic resonance applications.

In particular, the strip conductor can comprise a high-temperature superconductive layer, for example an oxidic superconductive layer. The strip conductor can alternatively or additionally also comprise a superconducting layer made of magnesium diboride.

A strip conductor with at least one insulating layer can be used to produce the coil winding. This can be advantageous for insulating the turns of the coil winding electrically from one other. The strip conductor can be coated with an electrically insulating layer in the form of an external layer. However, it can also be wrapped in an insulating strip. A strip conductor wrapped in this way would not be suitable for winding partial coils made from a pre-slit strip conductor since the wrapping would be destroyed by the slicing and would lose its mechanical cohesion. The taping of the individual conductor branches of a pre-slit strip conductor is also cumbersome. However, with the method described, there are no problems with first winding a taped strip conductor of this kind and subsequently dividing it into two partial coils. The winding endows the strip conductor with sufficient mechanical strength to hold the insulating taping of the conductor branches in place. This embodiment is particularly advantageous in combination with the use of an impregnation, bonding or encapsulating compound and curing before cutting.

After the cutting process, the cut surfaces of the two partial coils created by the division can be additionally provided with an electrically insulating layer in order to prevent short circuits between the conductive sections exposed by the cut. For example, the cut surfaces can be coated with epoxy resin.

The electrical coil device created can additionally be provided with superconducting sustained current switches and power supply leads to connect the coil to an external electric circuit feed and a current for sustained current operation.

FIG. 1 is a schematic top view of a superconducting strip conductor 1 with a doubly contiguous topology. The topology of the strip conductor 1 shown is produced by the subsequent division of a coil winding wound from a single strip conductor 1.

A first exemplary embodiment of the invention describes a magnetic coil for NMR spectroscopy. In this example, the length 7 of the strip conductor used is 1000 m. However, the length can also be much shorter or longer. In a magnetic coil for magnetic resonance imaging, the length can be a multiple of the length described here. After the division of a coil winding wound therefrom, the superconducting strip conductor 1 comprises two conductor branches 2 and 4 with approximately the same dimensions. A current $I_2$ flows through the first conductor branch 2 and a current $I_4$ flows through the second conductor branch in the opposite direction so that an enclosed ring current flows through the entire doubly contiguous superconducting strip conductor 1. In this example, the width 8 of the original, singly contiguous strip conductor is 10 mm, and the width of the two conductor branches 2 and 4 in the divided region is in each case 5 mm. However, depending upon the strip conductor material used, the width of the conductor branches 2, 4 can also be much greater or smaller; in particular the strip conductor 1 can also be asymmetrically divided. The two conductor branches 2 and 4 remain connected in the region of the two conductor ends 5 and 6.

Figure 2:
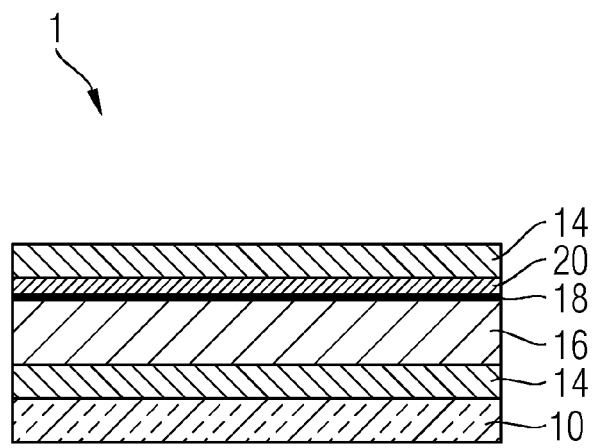
FIG. 2 is a cross section of the superconducting strip conductor.

FIG. 2 shows an exemplary cross section of a superconductive strip conductor 1 with a second generation high-temperature superconductor in a schematic depiction of the layer structure. In this example, the superconducting strip conductor 1 comprises an insulating layer 10 on its underside. In this example, the insulating layer 10 is a 50 μm thick Kapton tape, but it can also be made of other insulating materials, such as, for example, other plastics. The insulating layer 10 can also be omitted or alternatively insulating tape can be wound round the entire length of the strip conductor 1.

Above the insulating layer 10, the layer structure of the strip conductor 1 initially comprises a normally conducting cover layer 14, which, in this example, is a 20 μm thick copper layer. This is followed by the carrier tape 16, which, in this case is a 50 μm thick substrate made of a nickel-tungsten alloy. Steel tape or tapes made of an alloy such as, for example, Hastelloy can also be used. Arranged above the carrier tape 16 is a 0.5 μm thick buffer layer 18 containing the oxidic materials $CeO_2$ and $Y_2O_3$. After this comes the actual superconducting layer 20, here a 1 μm thick layer made of $YBa_2Cu_3O_x$, which is in turn covered by a 20 μm thick cover layer 14 made of copper. Alternatively, the cover layer 14 can also only be arranged on one side of the strip conductor—typically only on the side of the superconducting layer 20 facing away from the substrate. In the coil device to be produced, the superconducting layer 20 forms a continuous layer through the entire double cohesive topology.

Figure 3:
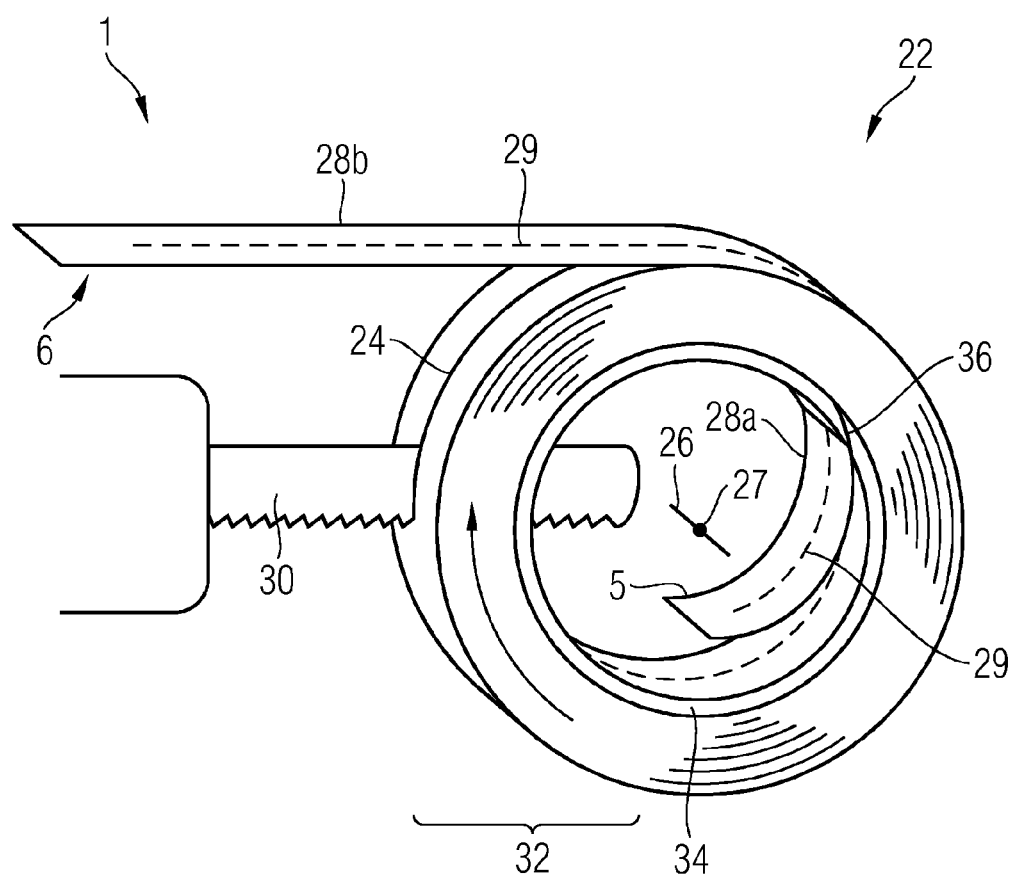
FIG. 3 is a schematic perspective view of the dividing step according to a first exemplary embodiment.

FIG. 3 shows the method step of the division of a coil winding 22 wound from the strip conductor 1 according to a first exemplary embodiment of the invention. In this example, the coil winding 22 is wound in the form of a circular cylindrical disc winding on a similarly circular cylindrical winding support 34. In this context, other coil geometries are also conceivable, but cylindrical, flat windings with an at least twofold symmetry of the base area are particularly advantageous. The coil winding 22 shown was produced by winding the strip conductor 1 about a central winding axis 26. In this context, the starting material used was a strip conductor 1 with singly cohesive topology, i.e. a normal strip conductor that had not been previously divided into individual conductor branches.

Before the strip conductor 1 is wound into the coil winding 22, an internal end piece 28a of the strip conductor is introduced into the interior of the winding support 34 through a slit 36 of the cylindrical winding support 34 provided for this purpose. As a result, an unwound inner projection 28a of the strip conductor remains in this inner space. A still unwound outer projection 28b of the strip conductor also remains in the external region of the coil winding 22. In this example, during the winding, the coil winding 22 was provided with an impregnating agent, which was cured before the division of the coil winding 22. In this context, the two unwound projections 28a and 29b were free of impregnating agent in order to keep these regions of the strip conductor as mobile as possible.

After the curing of the impregnating agent, the coil winding is then divided in two partial coils then in the process step shown schematically in FIG. 3. To this end, in this example, a dividing apparatus 30 introduces a cut 24 radially from the outside on the main part of the coil winding 22. In this example, the dividing apparatus 30 used is a saw with a penetration depth 32 that does not fully reach the center point 27 of the coil winding. However, it extends far enough into the interior in order to divide the winding support into two portions here as well. During the sawing process, the coil winding 22 is rotated about its winding axis 26 so that the different angular regions of the coil winding 22 are severed one after the other. Here, due to the restricted penetration depth, the inner projection 28a of the strip conductor is not completely severed. At least its outer end region 5 remains connected. Due to its mobility, this projection 28a can also be repeatedly removed during the cutting process from the area of influence of the dividing apparatus. Similarly, the not completely wound-on external projection 28b can be at least kept far enough away from the area of influence of the dividing apparatus 30 that at least its outer end region 6 is not severed. The dashed lines 29 mark dividing lines along which a sub-region of the projections 28a and 28b is also slit so that the partial coils forms can be moved relatively toward one another. The continuation of the cut 24 along these dividing lines 29 can either be performed together with the cutting step shown through the actual coil cylinder or the cut can be continued in a subsequent further cutting step as far as the end regions 5 and 6 that are to be protected from division.

Instead of the saw depicted schematically in FIG. 3, it is also possible for another dividing apparatus, for example an apparatus for laser cutting or water-jet cutting to be used. The penetration depth can then, for example, also be restricted by the winding support 34 so that the winding support 34 is not cut together with the turns of the coil winding 22. To this end, the coil support 34 could even from the outset comprise or consist of two portions, which, for example, can be inserted one into the other or be connected to one another in some other way. Hence, after the division of the turns of the strip conductor, the winding support 34 can be easily separated into two portions, which then function as carriers for the two partial coils created.

FIGS. 4 and 5 show two sub-steps of the division process of the coil winding 22 according to a second exemplary embodiment of the invention. FIG. 4 shows how the coil winding 22 is divided into two parts by a dividing apparatus 30 on a first circumferential segment 37a. In FIG. 5, it is subsequently divided into two parts on a second circumferential segment 37b. In similar way, division into a still higher number of sub-steps for more than two circumferential segments is conceivable. In FIGS. 4 and 5, the circumferential segments 37a and 37b are precisely two cylinder halves. Due to their free mobility, during the different partial cuts, the internal and external projections 28a and 28b can in each case be moved out of the area of influence of the dividing apparatus. For example, the external projection 28b can always be unrolled far enough for it to lie outside the circumferential segment 37a or 37b that is actually to be separated. In a similar way, the inner projection can, at least in its end region 5 to be protected, removed from the circumferential segment 37a or 37b that is actually to be separated.

In the second exemplary embodiment shown with a plurality of sub-steps of the dividing process, it is possible to use a continuous dividing apparatus 30 with no mechanical restriction of its penetration depth. Instead of the saw depicted schematically in the figures, it is also possible, for example, to use an apparatus for laser cutting or water-jet cutting.

Figure 6:
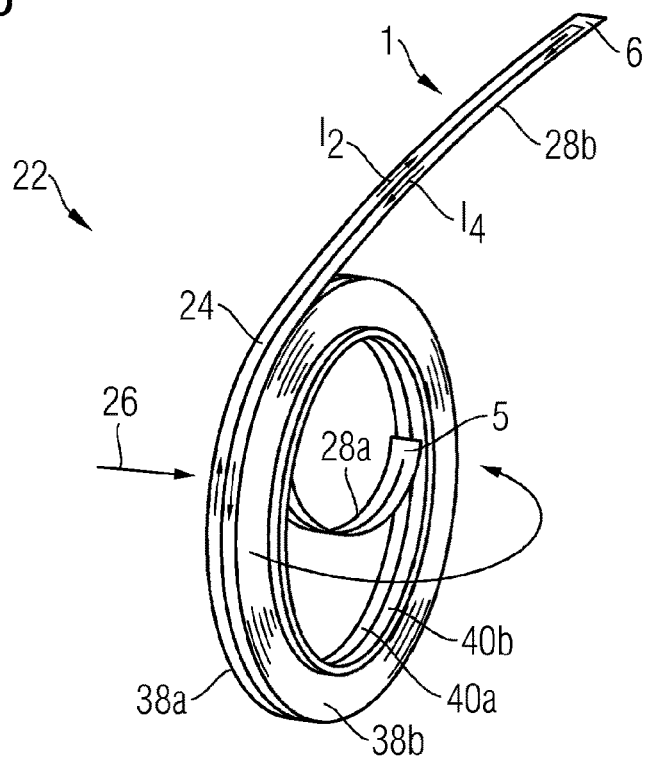
FIG. 6 is a schematic perspective depiction of a divided coil winding.

FIG. 6 is a schematic perspective view of the coil winding after the performance of the dividing step. This shows two partial coils 38a and 38b, the turns of which in each case lie on a portion 40a or 40b of the winding support 34. The partial coils 38a and 38b are divided by a cut 24 that continues inside and outside as far as the unwound projections 28a and 28b but not fully into the outermost end regions 5 and 6. Hence, after the dividing step, a coil winding 22 is provided with a strip conductor 1 connected at the ends with doubly contiguous topology. Similarly to FIG. 1, it comprises or consists of two conductor branches 2 and 4 the currents of which $I_2$ and $I_4$ form one contiguous ring current.

Figure 7:
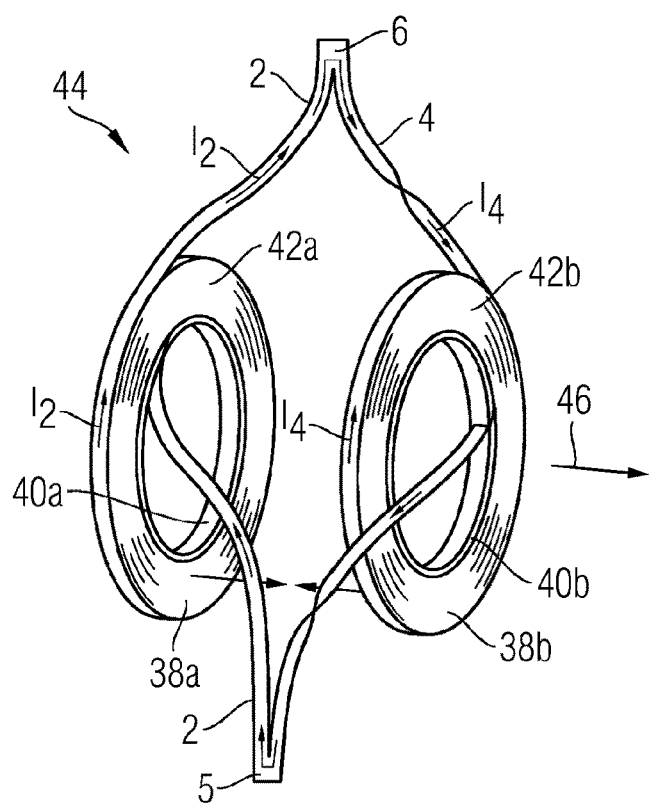
FIG. 7 is a schematic perspective depiction of a coil device with a suitable spatial alignment of two partial coils.

FIG. 7 shows a coil device 44 formed from the divided coil winding 22 with which the two partial coils 38a and 38b have been rotated with respect to one another. Following the rotation shown of the partial coil 38b relative to the partial coil 38a, the partial currents $I_2$ and $I_4$ flow with the same direction of rotation about a common system axis 46 of the coil device so that magnetic fields generated by these partial currents can be mutually reinforcing. The unwound projections 28a and 28b slit as far at their outermost end regions 5 and 6 facilitate the relative mobility of the electrically connected partial coils which are electrically connected by these end regions 5 and 6.

For electrical insulation and/or for mechanical protection of the strip conductor 1, the two cut surfaces 42a and 42b of the partial coils divided from one another can additionally be provided with an impregnating agent or another type of protective layer. The two partial coils 40a and 40b can also be moved significantly closer to each other than indicated in FIG. 7. The two partial coils 40a and 40b can also be arranged very closely adjacent. It is only necessary for it to be possible for at least one conductor branch of the strip conductor 2 or 4 to be guided between the inner surfaces of the partial coils 40a and 40b.

Figure 8:
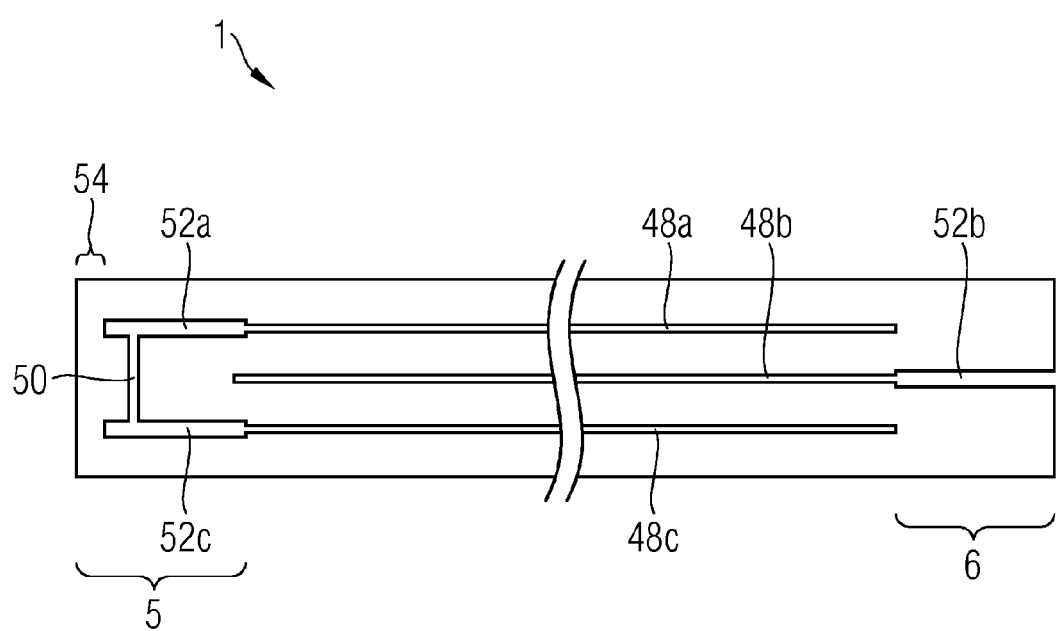
FIG. 8 is a schematic depiction of the topology of the strip conductor in a coil device with four partial coils.

FIG. 8 is a schematic diagram of the topology of a strip conductor 1 divided by three cuts 48a, 48b and 48c into four interconnected conductor branches. The strip conductor is also provided with a further transverse division 50 perpendicular to the primary direction of the cuts and with three further continuations 52a, 52b and 52c of the cuts at its end regions 5 and 6. In this case, the second continuation 52b, i.e. here the continuation of the middle cut 48b, extends as far as the outermost edge of the strip conductor. The other two continuations finish shortly before the most extreme contiguous end region 54. This once again achieves a higher-level topology of the strip conductor 1 in the form of a doubly contiguous loop, in this case with four conductor branches extending in parallel in the central region. This topology of the strip conductor can also be achieved in a coil device 44 with the disclosed method in that the turns of a coil winding are divided in their central region with three cuts extending in parallel and in that the necessary continuations and transverse divisions are then introduced in the end regions. Once again with this example, the four partial coils created can be moved and aligned toward one another such that the magnetic fields generated thereby on a current flow are intensified in a desired manner.

Similarly to the topology shown in FIG. 8 with four conductor branches, more complex divisions into other numbers of conductor branches and hence other numbers of partial coils are possible. It is also possible for asymmetrical or at least uneven divisions of the strip conductor to be performed with which conductor branches with different widths are created. The essential factor is that the division of the strip conductor into two or more partial coils is only performed following the winding of the coil winding.

What is claimed is:

1. A method for producing an electrical coil, the method comprising:
    winding a strip conductor into a coil winding having a stack of strip conductor layers,
    wherein winding the strip conductor comprises winding a first portion of the strip conductor into the coil winding, but leaving at least one of an internal end piece or an external end piece of the strip conductor as an unwound projection, and
    dividing the coil winding into at least two partial coils by performing at least one cut through the stack of strip conductor layers while the layers are wound in the coil winding,
    wherein after the at least one cut through the stack of strip conductor layers, the strip conductor remains connected at end regions of the strip conductor, to thereby define the electrical coil including a contiguous loop shape of the strip conductor that includes the at least two partial coils and the connected end regions of the strip conductor.

2. The method of claim 1, further comprising:
    performing the winding the strip conductor within a winding plane, and
    performing the at least one cut through the stack of strip conductor layers of the coil winding substantially parallel to the winding plane.

3. The method of claim 1, further comprising dividing at least a part of the unwound projection of at least one of the internal end piece or the external end piece into two conductor parts.

4. The method of claim 3, comprising dividing the unwound projection of the at least one of the internal end piece or the external end piece into two conductor parts in a process after and separate from the dividing the coil winding by the at least one cut through the stack of strip conductor layers.

5. The method of claim 1, wherein the dividing step comprises dividing the coil winding into the at least two partial coils using a dividing apparatus with a penetration depth extending through the stack of strip conductor layers but not reaching a center point of the coil winding.

6. The method of claim 1, wherein the winding step comprises winding the strip conductor onto a winding support with a cylindrical winding surface, wherein the winding support includes a slit-shaped recess into which an internal end piece of the strip conductor is introduced prior to the winding.

7. The method of claim 1, wherein the dividing step comprises dividing the coil winding into the at least two partial coils by sawing, water-jet cutting, or laser cutting through the stack of strip conductor layers.

8. The method of claim 1, further comprising, after the dividing step, spatially arranging the at least two partial coils such that magnetic fields generated thereby on a current flow through the strip conductor are mutually reinforcing.

9. The method of claim 1, further comprising, during the winding step, impregnating the strip conductor with an impregnating agent which is cured after the winding step.

10. The method of claim 1, wherein the coil winding is divided into more than two partial coils by multiple cuts.

11. The method of claim 1, wherein the strip conductor comprises a superconducting layer.

12. The method of claim 1, wherein the strip conductor comprises at least one insulating layer.

13. A method for the production of an electrical coil device, the method comprising:
    winding a strip conductor into a coil winding, and
    dividing the coil winding into at least two partial coils by performing at least one cut through the coil winding using a dividing apparatus with a penetration depth into the coil winding that does not reach a center point of the coil winding,
    wherein after the at least one cut, the strip conductor remains connected at end regions of the strip conductor, to thereby define a contiguous loop shape of the strip conductor that includes the at least two partial coils and the connected end regions of the strip conductor.

14. A method for the production of an electrical coil device, the method comprising:
    winding a strip conductor into a coil winding,
    during the winding step, impregnating the strip conductor with an impregnating agent which is cured after the winding step, and
    dividing the coil winding into at least two partial coils by performing at least one cut through the coil winding,
    wherein after the at least one cut, the strip conductor remains connected at end regions of the strip conductor, to thereby define a contiguous loop shape of the strip conductor that includes the at least two partial coils and the connected end regions of the strip conductor.

* * * * *